US012672315B2

(12) United States Patent
Barlage et al.

(10) Patent No.: US 12,672,315 B2
(45) Date of Patent: Jun. 30, 2026

(54) THIN-FILM TRANSISTORS HAVING A METAL NITRIDE SOURCE MATERIAL AND RELATED METHODS

(71) Applicant: ZINITE CORPORATION, Edmonton (CA)

(72) Inventors: Douglas Barlage, Edmonton (CA); Alex Ma, Edmonton (CA); Gem Shoute, Edmonton (CA)

(73) Assignee: ZINITE CORPORATION, Edmonton (CA)

( * ) Notice: Subject to any disclaimer, the term of this patent is extended or adjusted under 35 U.S.C. 154(b) by 0 days.

(21) Appl. No.: 19/261,813

(22) Filed: Jul. 7, 2025

(65) Prior Publication Data

US 2026/0032965 A1 Jan. 29, 2026

Related U.S. Application Data

(60) Provisional application No. 63/675,365, filed on Jul. 25, 2024.

(51) Int. Cl.
*H10D 30/67* (2025.01)
*H10D 30/01* (2025.01)

(52) U.S. Cl.
CPC ....... *H10D 30/6755* (2025.01); *H10D 30/031* (2025.01); *H10D 30/0314* (2025.01); *H10D 30/6731* (2025.01); *H10D 30/6737* (2025.01); *H10D 30/6757* (2025.01)

(58) Field of Classification Search
CPC ........... H10D 30/6755; H10D 30/6731; H10D 30/6757; H10D 30/0314; H10D 30/6737; H10D 30/031
See application file for complete search history.

(56) References Cited

U.S. PATENT DOCUMENTS

| | | | |
|---|---|---|---|
| 5,640,067 A | 6/1997 | Yamauchi et al. | |
| 8,940,647 B2 * | 1/2015 | Liu | H01L 21/0234 |
| | | | 257/E21.085 |
| 9,136,355 B2 | 9/2015 | Ahmed | |
| 10,731,273 B2 | 8/2020 | Meldrium et al. | |
| 11,949,019 B2 | 4/2024 | Barlage et al. | |
| 2010/0075469 A1 * | 3/2010 | Liu | B82Y 10/00 |
| | | | 438/151 |

(Continued)

FOREIGN PATENT DOCUMENTS

| | | | |
|---|---|---|---|
| WO | WO-2015109825 A1 * | 7/2015 | ......... H10D 30/6757 |
| WO | WO-2023285936 A1 | 1/2023 | |
| WO | WO-2023285951 A1 | 11/2025 | |

OTHER PUBLICATIONS

Jeong, Joo Hee, et al. "Specific contact resistivity reduction in amorphous IGZO thin-film transistors through a TiN/IGTO heterogeneous interlayer." Scientific Reports 14.1 (2024): 10953.

*Primary Examiner* — Alonzo Chambliss
(74) *Attorney, Agent, or Firm* — PERRY + CURRIER INC.

(57) ABSTRACT

An example thin-film transistor includes a substrate, a source including a body of source material on the substrate, a drain including a body of drain material on the substrate, a body of channel material between the source and the drain, a body of gate dielectric material on the body of channel material, and a body of gate material on the body of gate dielectric material. The source material includes a metal nitride.

24 Claims, 6 Drawing Sheets

(56) References Cited

U.S. PATENT DOCUMENTS

| | | | |
|---|---|---|---|
| 2010/0224882 A1* | 9/2010 | Lee | H01L 21/02488 |
| | | | 257/66 |
| 2013/0256651 A1* | 10/2013 | Tsang | H10D 64/62 |
| | | | 257/E29.296 |
| 2019/0006519 A1 | 1/2019 | Chen et al. | |
| 2019/0043946 A1* | 2/2019 | Lee | H10D 62/151 |
| 2020/0279953 A1 | 9/2020 | Sharma et al. | |
| 2021/0184039 A1 | 6/2021 | Liu | |
| 2023/0095169 A1* | 3/2023 | Zhao | H10D 30/6723 |
| | | | 257/43 |
| 2024/0055529 A1* | 2/2024 | Barlage | H10D 30/6757 |
| 2024/0213370 A1 | 6/2024 | Barlage et al. | |
| 2025/0087285 A1 | 3/2025 | Chang | |
| 2025/0351433 A1* | 11/2025 | Barlage | H10D 30/6755 |

* cited by examiner

THIN-FILM TRANSISTORS HAVING A METAL NITRIDE SOURCE MATERIAL AND RELATED METHODS

CROSS-REFERENCE TO RELATED APPLICATIONS

This application claims priority to U.S. provisional application 63/675,365, filed Jul. 25, 2024. The entire contents of the foregoing are incorporated herein by reference.

FIELD

The present invention relates to thin-film transistors.

BACKGROUND

Thin-film transistors (TFTs) are presently widely employed in semiconductor devices. TFTs get their name from the fact that they are typically fabricated from very thin layers of semiconductor materials, metals, and insulators. The materials and processes used to form TFTs influence their characteristics, such as reliability and stability.

SUMMARY

According to an aspect of the present invention, a thin-film transistor includes a substrate, a source including a body of source material on the substrate, a drain including a body of drain material on the substrate, a body of channel material between the source and the drain, a body of gate dielectric material on the body of channel material, and a body of gate material on the body of gate dielectric material. The source material includes a metal nitride.

The drain material may include a metal nitride.

The channel material may include an oxide semiconductor.

The source may further include a source carrier reservoir of a reservoir material between the body of source material and the body of channel material.

The reservoir material may be the same as the channel material.

The reservoir material may be an oxide semiconductor.

The metal nitride may be titanium nitride, zirconium nitride, hafnium nitride, or a combination of such.

The body of source material may include a source-channel interface that is a layer of oxidized material.

According to another aspect of the present invention, a method of manufacturing a thin-film transistor includes forming a source including a body of source material on a substrate, forming a drain including a body of drain material on the substrate, forming a body of channel material between the source and the drain, forming a body of gate dielectric material on the body of channel material, and forming a body of gate material on the body of gate dielectric material. The source material comprises a metal nitride.

The forming of the body of channel material may include forming a first layer of channel material, performing a treatment on the first layer of channel material, and forming a second layer of channel material on the first layer of channel material.

The channel material may be formed of an oxide semiconductor.

The forming of the body of source material may include using atomic layer deposition to deposit the body of source material.

The method may further include applying a forming gas plasma to the body of source material during the atomic layer deposition of the body of source material.

The method may further include applying a forming gas plasma to the substrate before the forming of the body of source material.

The method may further include plasma treating the body of source material after the forming of the body of source material and before forming the body of channel material.

The method may further include applying an oxygen plasma to the body of source material after the forming of the body of source material and before forming the body of channel material.

The drain material may be formed of a metal nitride.

The method may further include forming a source carrier reservoir of a reservoir material between the body of source material and the body of channel material.

The reservoir material may be the same as the channel material.

The reservoir material may be highly doped oxide semiconductor.

The metal nitride may be titanium nitride, zirconium nitride, hafnium nitride, or a combination of such.

DETAILED DESCRIPTION

The present invention relates to thin-film transistors or TFTs that use metal nitride, such as titanium nitride, as the source and, optionally, the drain.

Certain metal nitrides, such as titanium nitride, may be useful for a TFT source/drain because of their stability and lack of reactivity with metal oxides that may be used as channel materials. This may reduce or eliminate the problem of a source/drain formed of elemental metal drawing oxygen from the metal-oxide semiconductor and becoming oxidized, which can undesirably affect the performance characteristics of the TFT. Moreover, the present invention provides materials and related structures for use in the making of TFTs, so as to offer increased flexibility and choice to manufacturers. These and other aspects and advantages of the present invention will be discussed in greater detail below.

Figure 1A:
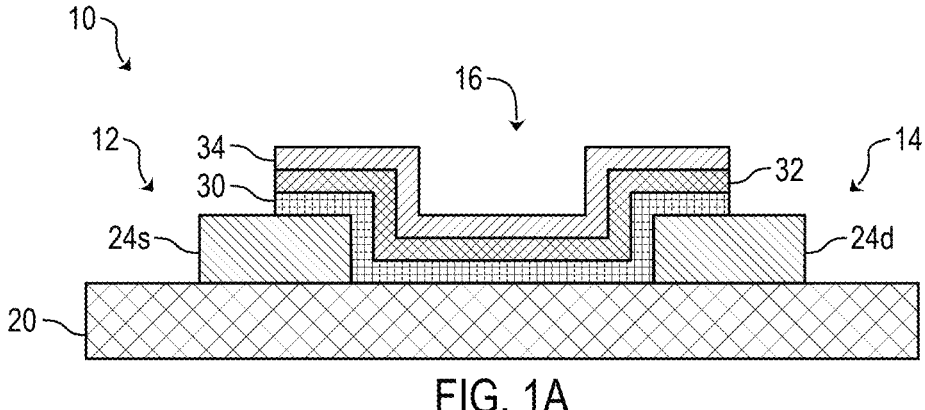
FIG. 1A is a cross-sectional view of an example thin-film transistor with a metal nitride source according to the present invention.

FIG. 1A shows an example TFT 10 according to the present invention. The TFT 10 includes a source 12, drain 14, and gate 16.

The TFT 10 is formed with a substrate 20. The substrate 20 may be disposed over another layer of transistors, whether manufactured in accordance with the present invention or by another technique, or over a layer of complementary metal-oxide-semiconductor (CMOS) devices or other front end of line (FEOL) devices. The TFT 10 may be manufactured using back end of line (BEOL) and/or middle of line (MOL) processes or, more particularly, processes that are generally performed at or below 400° C.

Examples of substrates 20 include silicon dioxide ($SiO_2$); carbon doped oxide (CDO); silicon nitride; glass; organic polymers such as perfluorocyclobutane or polytetrafluoroethylene; fluorosilicate glass (FSG); organosilicates such as silsesquioxane, siloxane, organosilicate glass; flexible polymers; plastic; a silicon wafer whose surface is processed with wet thermal oxide (WTO) or similar treatment; etc. The substrate 20 may be an interlayer dielectric (ILD), such as may be the case when layers of TFTs are stacked.

The source 12 is formed of a body of source material 24s that includes metal nitride, such as titanium nitride, zirconium nitride, hafnium nitride, or a combination of such. The examples discussed in detail herein refer to titanium nitride. It should be understood that the examples may use zirconium nitride, hafnium nitride, or combinations of these materials without departing from the present invention.

In this example, the source material 24s is completely titanium nitride with a thickness within the range of about 5 nm to about 30 nm or, more particularly, within the range of about 10 nm to about 25 nm. In this example, the source material 24s has a thickness of about 15 nm.

The drain 14 may have the same or similar material and/or structure as the source 12. The drain 14 may be formed of a body of drain material 24d that includes metal nitride. In this example, the body of drain material 24d is formed in the same way as the body source material 24s. In other examples, the drain 14 has a material and/or structure different to the source 12.

The TFT 10 further includes a body of channel material 30 disposed between the source 12 and drain 14. The channel material 30 is an n-type semiconductor and is preferably a metal oxide. In this example, the channel material 30 is disposed partially over and between the source and drain material 24s, 24d and over the substrate 20 between the source and drain material 24s, 24d. In this example, channel material 30 is thin-film metal-oxide semiconducting material with a thickness of about 5 nm to about 10 nm, such as about 7 nm.

The TFT 10 further includes a body of gate dielectric material 32 disposed over the channel material 30 and a body of gate material 34 disposed over the gate dielectric material 32. The gate dielectric material 32 may be formed of a high-K dielectric, such as hafnium oxide. Other examples of gate dielectric materials 32 include, without limitation, silicon dioxide, silicon nitride, zirconium oxide, and aluminum oxide. The gate material 34 is a conductor and may be any suitable gate material as will occur to those of ordinary skill in the art including, without limitation, tungsten, titanium, titanium nitride, molybdenum, gold, platinum, aluminum, nickel, copper, chromium, hafnium, indium, manganese, iron, vanadium, zinc, tantalum, or alloys/combinations thereof.

Figure 1B:
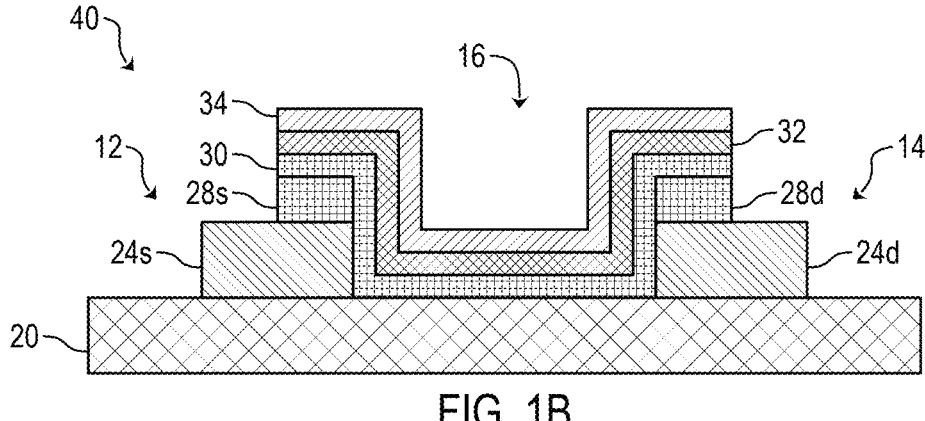
FIG. 1B is a cross-sectional view of another example thin-film transistor with a source carrier reservoir according to the present invention.

FIG. 1B shows another example TFT 40 according to the present invention. The TFT 40 is substantially the same as the TFT 10 except that source and drain carrier reservoirs 28s, 28d are provided. The above description may be referenced for details not repeated below.

In this example, the source 12 includes a source carrier reservoir 28s formed of a reservoir material. The source carrier reservoir 28s may be a metal oxide with a naturally high concentration of n-type carriers. The source carrier reservoir 28s may be doped to further increase its n-type concentration. Examples of materials that may be used for the source carrier reservoir 28s include, without limitation, tin oxide, titanium oxide, indium gallium zinc oxide (IGZO), tungsten oxide, and indium tin oxide.

The source carrier reservoir 28s may be formed over (with respect to the depicted orientation) and in contact with the source material 24s. The source carrier reservoir 28s may be formed to a thickness of about 5 nm to about 20 nm or more. More specifically, in various examples, the thickness of the source carrier reservoir 28s may be about 5 nm to about 10 nm, such as about 7 nm.

Source carrier reservoir 28s acts as a charge source that is adjacent source material 24s and channel material 30 to provide a reservoir of negative charge carriers to mitigate carrier starvation. If used, drain reservoir 28d may serve a similar purpose for the drain 14.

Source carrier reservoir 28s can cause the electron barrier between the channel formed in channel material 30 and source carrier reservoir 28s and source material 24s to be reduced or minimized, or to form a slowly increasing gradient, so that electrons do not experience a significant reflection probability when traversing a boundary between source carrier reservoir 28s, source material 24s, and channel material 30.

In various examples, source carrier reservoir 28s preferably has an effective electron mass, or density, of available electronic states that are at the same or similar level as the channel material 30. This may be achieved with the source carrier reservoir 28s and channel material 30 being the same material.

Drain reservoir 28d, if used, serves as an electron receiver to enhance the flow of electrons out of the channel formed in channel material 30.

In this example, the channel material 30 is the same material as the reservoirs 28s, 28d, and is disposed over and between the reservoirs 28s, 28d and over the substrate 20 between the source and drain material 24s, 24d. The channel material 30 has a thickness of about 5 nm to about 10 nm, such as about 7 nm.

Figure 1C:
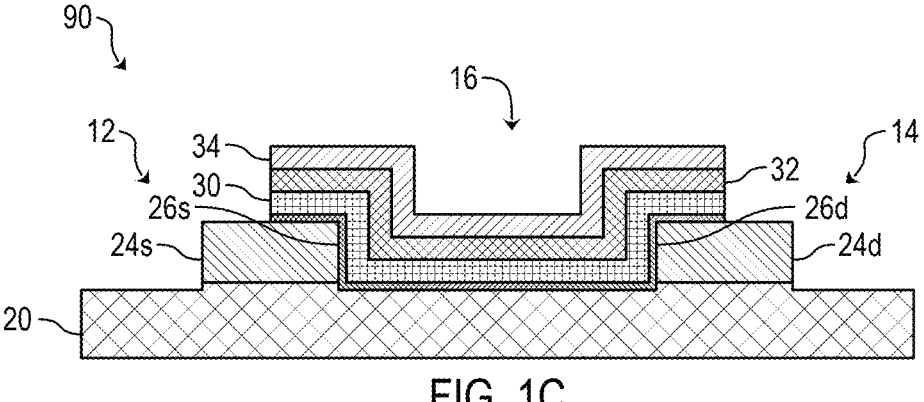
FIG. 1C is a cross-sectional view of another example thin-film transistor with a channel interface according to the present invention.

FIG. 1C shows another example TFT 90 according to the present invention. The TFT 90 is substantially the same as the TFT 10 except that source and drain channel interfaces 26s, 26d are provided. The above description may be referenced for details not repeated below.

In this example, the body of source material 24s is treated with oxygen plasma to form a layer of oxidized material, i.e., source-channel interface 26s, that is operable to deplete the channel material 30. In this example, wherein the channel material 30 is n-type, the source-channel interface 26s may be a p-type material. In other examples, the source-channel interface 26s may be n-type. In addition, the body of drain material 24d is likewise treated to form a similar drain-channel interface 26d. In other examples, the drain-channel interface 26d is omitted.

The properties and features of the channel interfaces 26s, 26d, and specifically the source-channel interface 26s, are discussed below. Further reference may be made to U.S. Pat. No. 11,949,019, which is incorporated herein by reference.

It should be noted that features and aspects of the TFTs 10, 40, 90 may be combined without departing from the present invention. For example, the source-channel interface 26s and the carrier reservoirs 28s, 28d may be used together in another example TFT in accordance with the present invention.

FIGS. 2A-2M show an example method of forming a TFT, such as the TFTs 10, 40, 90 discussed above, according to the present invention. Advantageously, the method may be performed using BEOL and/or MOL processes, which may be limited to a maximum temperature of 400° C. The method may be used to form one or more layers of TFTs 10, 40, 90 over other devices made using FEOL, MOL, or BEOL processes. In addition, it is noted that the method is described with respect to example materials. It should be understood that the method may use any suitable materials discussed above with regard to the TFTs 10, 40, 90.

The manufacture of materials, layers, and/or features of semiconductor devices is referred to herein as "forming." As will be apparent to those of ordinary skill in the art, unless otherwise mentioned, "forming" is intended to include all semiconductor manufacturing techniques suitable and applicable therefor including, without limitation, deposition (i.e., chemical vapor deposition or CVD, atomic layer deposition or ALD, physical vapor deposition or PVD, etc.), plasma-enhanced/assisted atomic layer deposition (PEALD/ PAALD), plasma-enhanced chemical vapor deposition (PECVD), sputtering, lithography/photolithography, etching, implantation, annealing, oxidation, and similar processes. While examples of specific types of forming are given below, it should be understood that comparable methods of forming may be alternatively or additionally used, unless otherwise mentioned, without departing from the present invention.

Figure 2A:
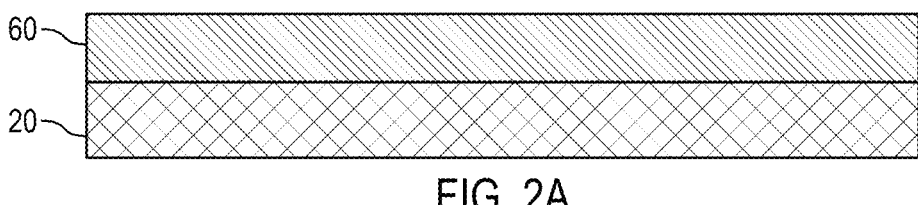
FIGS. 2A-2M are cross-sectional views of an example method of manufacturing a thin-film transistor with a metal nitride source according to the present invention.

As shown in FIG. 2A, the method starts with a substrate 20, such as silicon dioxide, glass, etc., as discussed above.

In this example, a source/drain material 60 of titanium nitride is formed over the substrate 20.

Before forming the source/drain material 60 on the substrate 20, the substrate 20 may be treated with a forming gas plasma, i.e., nitrogen/hydrogen plasma, for a duration of, for example, about 30 seconds. In addition or as an alternative to forming gas plasma, nitrogen plasma may be applied to the substrate 20. The forming gas and/or nitrogen plasma may clean and/or stabilize the surface of the substrate 20 to aid the forming of the source/drain material 60 on the substrate. It should be noted that a separate adhesion layer may specifically be omitted due to the adhering properties of titanium nitride.

In this example, the source/drain material 60 is formed by ALD. A suitable titanium precursor and reactant (e.g., nitrogen gas or plasma) may be used. Forming gas plasma may be applied to the deposited material during ALD cycles. The forming gas plasma may be applied during each ALD cycle. The source/drain material 60 may be formed to a thickness of about 15 nm.

Next, the source/drain material 60 is patterned using lithography and etching, as shown in FIGS. 2B to 2G. Any suitable lithographic and etching processes may be used.

Figure 2B:
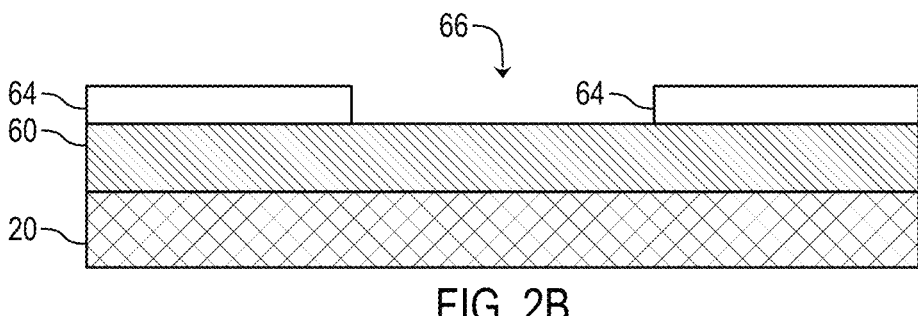

As shown in FIG. 2B, forming continues when a lithographic patterning is performed, which includes applying a first pattern of photoresist 64 on the source/drain material 60. The first pattern of photoresist 64 defines a gap 66, within which source/drain material 60 will be removed by etching or other suitable process.

Figure 2C:
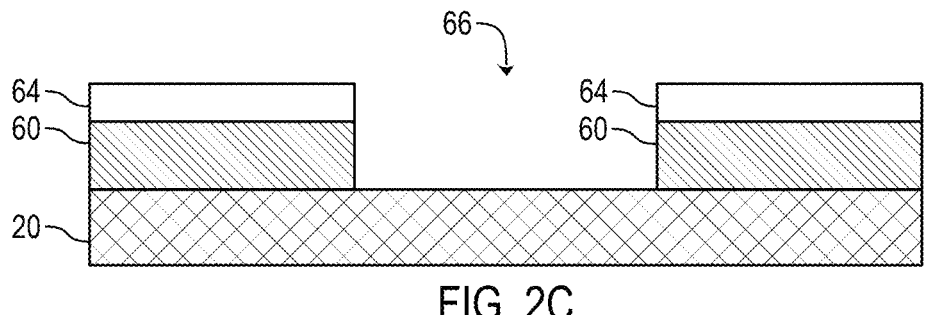

As shown in FIG. 2C, source/drain material 60 within gap 66 is etched according to the first pattern of photoresist 64 to expose the substrate 20 in gap 66.

To etch the source/drain material 60, an inductively coupled plasma reactive ion etching (ICPRIE) process may be used. Reactant gases may include chlorine and argon.

Figure 2D:
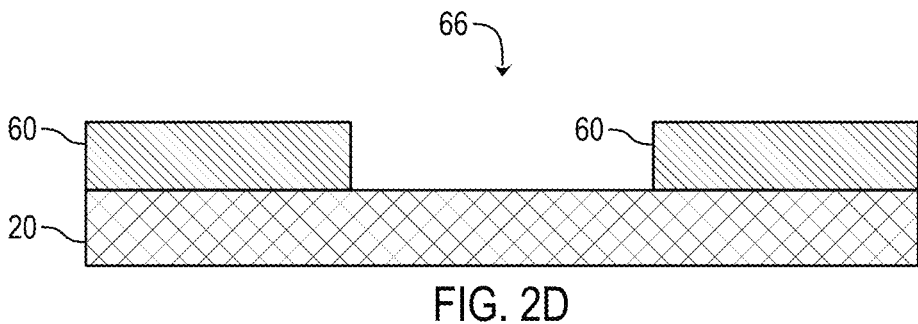

Next, as shown in FIG. 2D, the first pattern of photoresist 64 is removed.

Figure 2E:
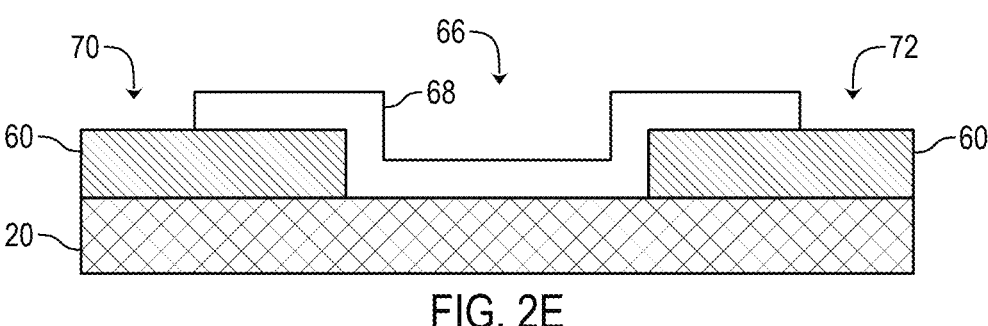

As shown in FIG. 2E, a second lithographic patterning is performed. A second pattern of photoresist 68 is applied to the source/drain material 60 and substrate 20 within gap 66, leaving outer regions 70, 72 of the source/drain material 60 exposed for etching.

Figure 2F:
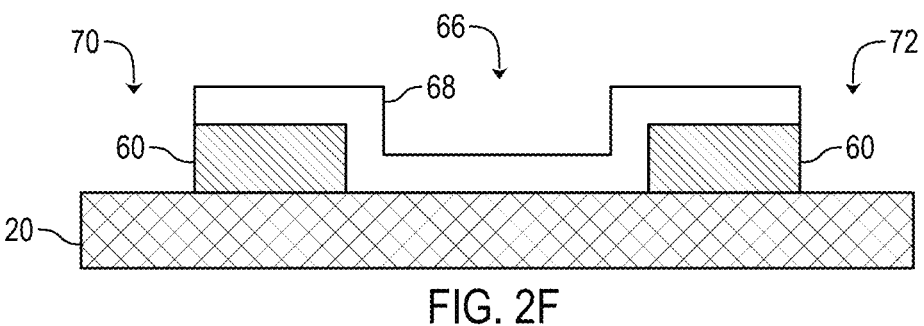

As can be seen in FIG. 2F, the source/drain material 60 is etched according to the second pattern of photoresist 68 to expose the substrate 20 at the outer regions 70, 72.

It is contemplated that this two-step litho-etch process using patterns of photoresist 64, 68 provides for sharper definition of the source/drain material 60, so that the resulting source 12 and drain 14 have sharper feature definitions. The second pattern of photoresist 68 shields the gap 66 in the source/drain material 60 formed with the first pattern of photoresist 64. In other examples, a single-step litho-etch process may be used.

Figure 2G:
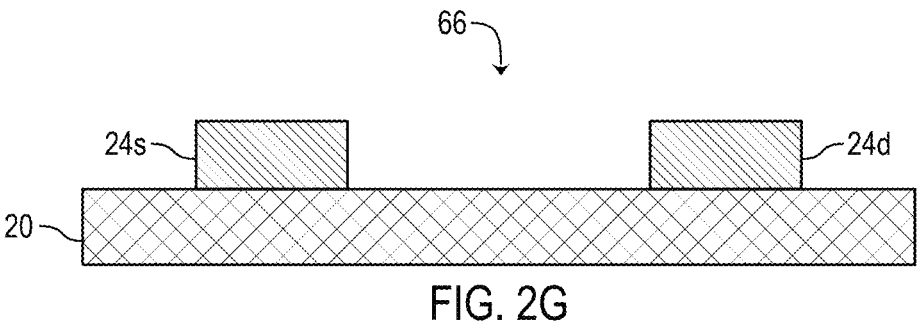

Next, as shown in FIG. 2G, the second pattern of photoresist 68 is removed and the remaining source/drain material 60 forms the body of source material 24s and the body of drain material 24d.

Subsequently, as shown in FIGS. 2H to 2K, a body of channel material 30 is formed between the bodies of source and drain material 24s, 24d. In this example, the channel material 30 is a metal-oxide semiconductor.

Before forming the body of channel material 30, the body of source material 24s may be subject to in-line plasma treatment, in-line anneal treatment, chemical or electrochemical treatment, etc. This treatment may be repeated two or more times. Such treated material 92 is shown in FIG. 3, which represents this optional treatment step that may be performed between the steps of FIGS. 2G and 2H. It should be noted that the subsequent litho-etch described with regard to FIGS. 2I-2K may remove excess exposed treated material 92 present on the source and drain materials 24s, 24d and substrate 20 to arrive at the structures of the source/drain-channel interfaces 26s, 26d shown in FIG. 1C.

This in-line treatment may form a p-type (or n-type, in other examples) source-channel interface (ref. 26s of FIG. 1C) at the body of source material 24s between source material 24s and channel material 30. The source-channel interface may reduce leakage current through TFT 90 in the OFF state. The source-channel interface may create a repository of complimentary excess positive or negative charge that functions to deplete the channel in at least the region of channel material 30 adjacent source material 24s and source carrier reservoir 28s, if used. In this manner, source-channel interface serves as a voltage-controlled electron transport barrier, resulting in substantially less current flow through channel material 30 when TFT 90 is in an OFF state. Further, source-channel interface can also serve to reduce stress induced leakage currents ("SILC") in TFT 90 by inhibiting the formation of interlayer stress-induced flaws between channel material 30 and source material 24s. A drain-channel interface (ref. 26d of FIG. 1C) may be similarly formed and may have similar characteristics, but it is contemplated that the source-channel interface provides a significant benefit without the drain-channel interface and may provide most or all of the benefit.

Due to the nature of the treatment, it may be the case that the treatment results in the substrate 20 and/or drain material 24d being treated when only the source material 24s is desired to be treated. This "side effect" treatment of the substrate 20 and/or drain material 24d can be tolerated in many examples.

In addition, if a source and/or drain reservoir 28s, 28d is used, as shown in the TFT 40 of FIG. 1B, then such may be formed before forming the body of channel material 30. For example, a layer of reservoir material may be formed over source/drain material 60 and etched with source/drain material 60, as described above. When the reservoir material is the same as or similar to the channel material 30, then the same or similar process to form the channel material 30, discussed below, may be used to form the layer of reservoir material that becomes the source and/or drain reservoir 28s, 28d.

Figure 2H:
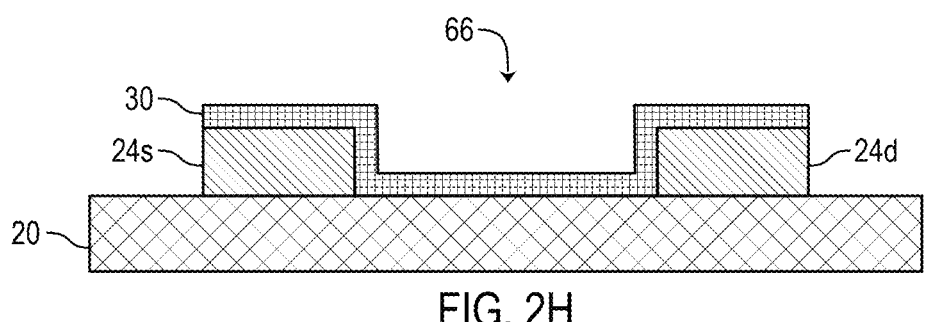
Figure 3:
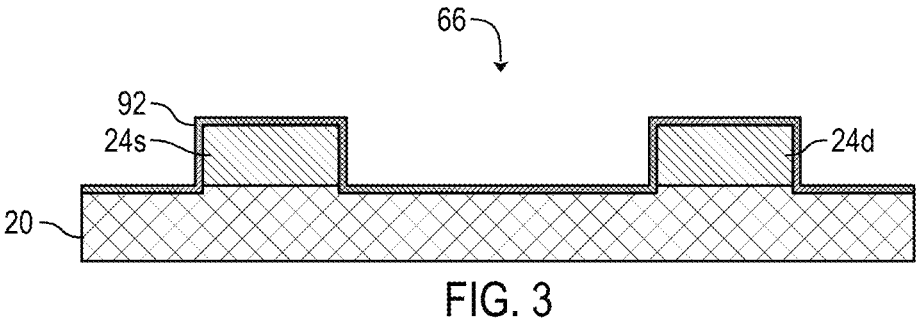
FIG. 3 is a cross-sectional view of an example method step of forming a source-channel interface.

As shown in FIG. 2H, the body of channel material 30 is formed over the bodies of source and drain material 24s, 24d and over the substrate 20 within gap 66 between the bodies of source and drain material 24s, 24d. In this example, the channel material 30 is formed to about 7 nm thick.

Forming the channel material 30 may be done using ALD with a suitable precursor and reactant.

The channel material 30 may be formed in multiple stages. First, an initial layer of channel material 30 is formed. Then, an in-line treatment such as plasma treatment, annealing, functionalization, etc., is performed on this initial layer of channel material 30. Then, a second layer of channel material 30 is formed over the first treated layer of channel material 30. The first layer may be about 1 nm thick and the second layer may be about 6 nm thick to arrive at a body of channel material 30 that is about 7 nm thick. This two-stage example is merely one example. The channel material 30 may be formed of two or more layers of various thicknesses with such treatment performed between formed layers.

The treatment provided to the initial layer of channel material 30 may help compensate for defects in the interface between the channel material 30 and underlying material, such as source material 24s. The treatment may lower the doping concentration (e.g., by reducing vacancies or interstitials) and therefore improve stability of the resulting TFT 10, 40, 90.

Figure 2I:
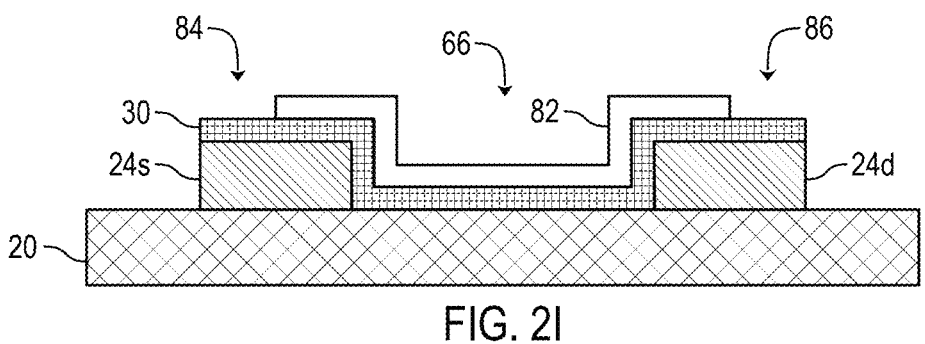

As shown in FIG. 2I, another lithographic patterning is performed, which includes applying a pattern of photoresist 82 on the channel material 30. Outer regions 84, 86 of the channel material 30 remain exposed.

Figure 2J:
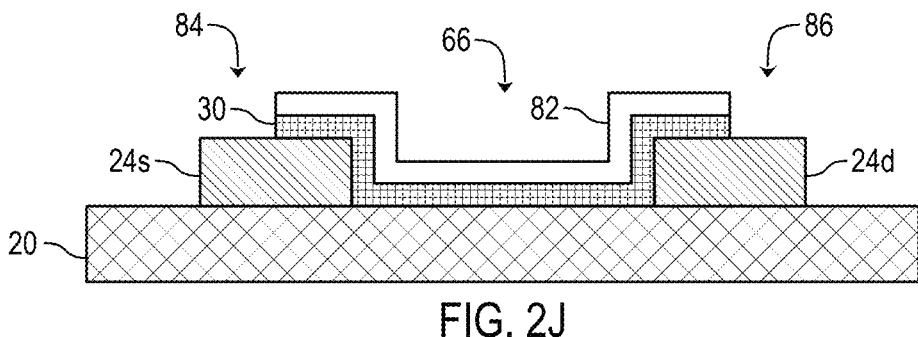

As shown in FIG. 2J, the channel material 30 is etched according to the pattern of photoresist 82 to expose the source and drain material 24s, 24d at the outer regions 84, 86, which may be useful for making source/drain electrical contacts. Exposed treated material 92 (see FIG. 3), if used, may also be removed.

Figure 2K:
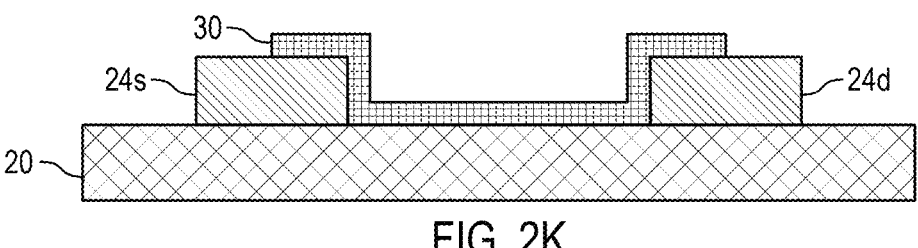

As shown in FIG. 2K, the photoresist 82 is removed.

Figure 2L:
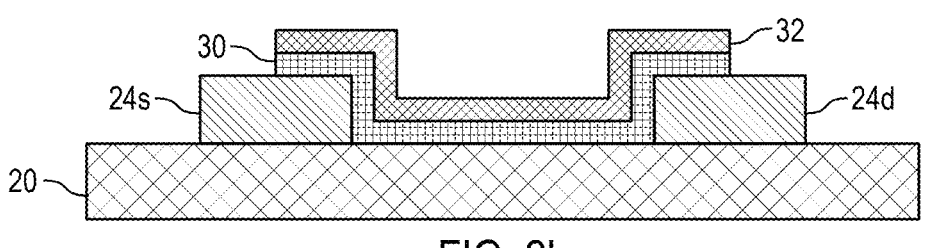

As shown in FIG. 2L, a layer of gate dielectric material 32, such as hafnium oxide, is formed over channel material 30. The gate dielectric material 32 may be formed to a thickness of about 2 nm to about 20 nm.

Figure 2M:
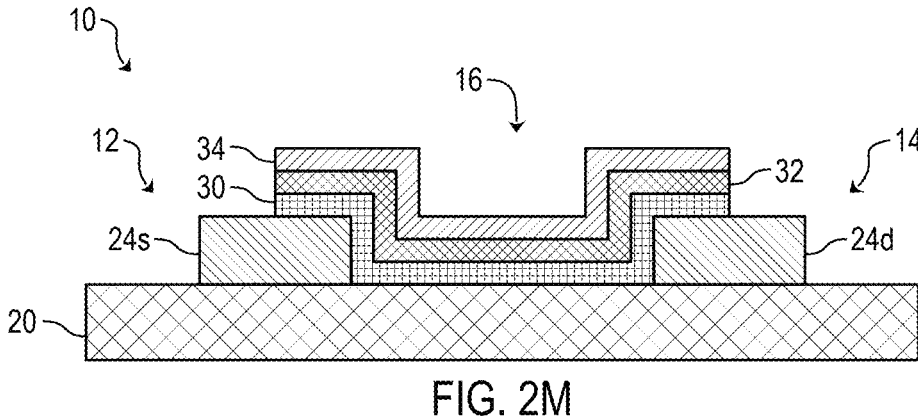

As shown in FIG. 2M, gate material 34 is formed over the gate dielectric material 32. Gate material 34 may be selected from a variety of materials, such as those discussed above.

Hence, as should be apparent, the structure of the TFT 10 of FIG. 1A is obtained. If source and/or drain reservoir 28s, 28d is used, then the structure of the TFT 40 of FIG. 1B is obtained. If a source-channel interface 26s (and optionally a drain-channel interface 26d) is used, then the structure of the TFT 90 of FIG. 1C is obtained.

Additional steps, which are omitted for sake of clarity and which will be readily apparent to those of ordinary skill in the art, may be performed as part of the method.

For example, contacts (not shown) are connected to the source 12, drain 14, and gate 16 to facilitate operation of the TFT 10, 40, 90.

Depending on the specific materials selected for various components of the TFT 10, 40, 90 produced by the above-described method, it may be desired to perform one or more anneal operations during the method. Determining the need for such anneals and/or when in the method they are performed is within the understanding of one of ordinary skill in the art of semiconductor fabrication given the benefit of this disclosure.

Encapsulation material, such as polyamide, spin-on glass, etc., may be formed within and/or over the structure. It is also contemplated that it may be desired to subsequently form another plane of TFTs, in accordance with the present invention, over the structure shown. In such case, encapsulation may include a layer of low-K dielectric, WTO, a layer of silicon dioxide, etc.

In the above description, auxiliary verbs "can" and "may" are used interchangeably herein to denote components, features, and/or aspects of the present invention that are capable, configurable, selectable, modifiable, or optional, as would be apparent to one of ordinary skill in the art given the benefit of this disclosure. These terms should not be taken as limiting the present invention, unless otherwise specified.

Spatial prepositions, such as "over", "under", "on", "above", "below", "up", "down", "beside", etc., are provided for sake of explanation and should not be taken as limiting the present invention to an absolute spatial orientation or arrangement, unless otherwise specified. For example, one of ordinary skill in the art would understand that a first element is above or below a second element depending on the perspective of the observer.

The articles "a", "an", "the", "said", etc. indicate singular and plural, unless otherwise specified.

The conjunction "or" is used inclusively and should be understood to mean "and/or", unless otherwise specified.

Sets of elements A, B, C described as A, B, or C; A, B, and C; A, B, and/or C; or A, B, C should be considered open sets from which one or more elements or a combination of one or more elements may be selected, unless otherwise specified. Sets of elements are open, unless specified to be closed, for example, by use of the term "consist", "consisting", or similar closed language.

The above clarifications apply to both the specification and claims.

The figures are not to scale, unless otherwise specified.

The above-described embodiments of the invention are intended to be examples of the present invention and alterations and modifications may be effected thereto, by those of ordinary skill in the art, without departing from the scope of the invention which is defined solely by the claims appended hereto.

The invention claimed is:

1. A thin-film transistor comprising:

a substrate;

a source including a body of source material on the substrate;

a drain including a body of drain material on the substrate;

a body of channel material between the source and the drain;

a body of gate dielectric material on the body of channel material; and a body of gate material on the body of gate dielectric material;

wherein the source material comprises a metal nitride;

wherein the source further comprises a source carrier reservoir of a reservoir material for mitigating carrier starvation between the body of source material and the body of channel material; and wherein the body of source material and the source carrier reservoir are in contact with the body of channel material.

2. The thin-film transistor of claim 1, wherein the drain material comprises a metal nitride.

3. The thin-film transistor of claim 1, wherein the channel material comprises an oxide semiconductor.

4. The thin-film transistor of claim 1, wherein the reservoir material is the same as the channel material.

5. The thin-film transistor of claim 1, wherein the reservoir material is an oxide semiconductor.

6. The thin-film transistor of claim 1, wherein the metal nitride is titanium nitride, zirconium nitride, hafnium nitride, or a combination of such.

7. The thin-film transistor of claim 1, wherein the body of source material includes a source-channel interface that is a layer of oxidized material.

8. A method of manufacturing a thin-film transistor, the method comprising:

forming a source including a body of source material on a substrate;

forming a drain including a body of drain material on the substrate;

forming a body of channel material between the source and the drain;

forming a body of gate dielectric material on the body of channel material; and forming a body of gate material on the body of gate dielectric material;

wherein the source material comprises a metal nitride;

wherein the forming of the body of channel material comprises:

forming a first layer of channel material;

performing a treatment on the first layer of channel material; and forming a second layer of channel material on the first layer of channel material.

9. The method of claim 8, wherein the channel material is formed of an oxide semiconductor.

10. The method of claim 8, wherein the forming of the body of source material comprises using atomic layer deposition to deposit the body of source material.

11. The method of claim 10, further comprising applying a forming gas plasma to the body of source material during the atomic layer deposition of the body of source material.

12. The method of claim 8, further comprising applying a forming gas plasma to the substrate before the forming of the body of source material.

13. The method of claim 8, further comprising plasma treating the body of source material after the forming of the body of source material and before forming the body of channel material.

14. The method of claim 8, further comprising applying an oxygen plasma to the body of source material after the forming of the body of source material and before forming the body of channel material.

15. The method of claim 8, wherein the drain material is formed of a metal nitride.

16. The method of claim 8, further comprising forming a source carrier reservoir of a reservoir material between the body of source material and the body of channel material.

17. The method of claim 16, wherein the reservoir material is the same as the channel material.

18. The method of claim 16, wherein the reservoir material is highly doped oxide semiconductor.

19. The method of claim 8, wherein the metal nitride is titanium nitride, zirconium nitride, hafnium nitride, or a combination of such.

20. A method of manufacturing a thin-film transistor, the method comprising:

forming a source including a body of source material on a substrate;

forming a drain including a body of drain material on the substrate;

forming a body of channel material between the source and the drain;

forming a source carrier reservoir of a reservoir material for mitigating carrier starvation between the body of source material and the body of channel material;

forming a body of gate dielectric material on the body of channel material; and forming a body of gate material on the body of gate dielectric material;

wherein the source material comprises a metal nitride;

wherein the channel material is formed of an oxide semiconductor; and wherein the body of source material and the source carrier reservoir are in contact with the body of channel material.

21. The method of claim 20, wherein the forming of the body of source material comprises using atomic layer deposition to deposit the body of source material.

22. A method of manufacturing a thin-film transistor, the method comprising:

forming a source including a body of source material on a substrate;

forming a drain including a body of drain material on the substrate;

forming a source carrier reservoir of a reservoir material for mitigating carrier starvation between the body of source material and a body of channel material;

forming the body of channel material between the source and the drain;

forming a body of gate dielectric material on the body of channel material; and forming a body of gate material on the body of gate dielectric material;

wherein the source material comprises a metal nitride; and wherein the body of source material and the source carrier reservoir are in contact with the body of channel material.

23. The method of claim 22, wherein the reservoir material is the same as the channel material.

24. The method of claim 22, wherein the reservoir material is highly doped oxide semiconductor.

* * * * *